US008823015B2

(12) United States Patent
Momose et al.

(10) Patent No.: US 8,823,015 B2
(45) Date of Patent: Sep. 2, 2014

(54) SILICON CARBIDE EPITAXIAL WAFER AND MANUFACTURING METHOD THEREFOR

(75) Inventors: Kenji Momose, Chichibu (JP); Yutaka Tajima, Chichibu (JP); Yasuyuki Sakaguchi, Chichibu (JP); Michiya Odawara, Chichibu (JP); Yoshihiko Miyasaka, Sanmu (JP)

(73) Assignee: Showa Denko K.K., Tokyo (JP)

( * ) Notice: Subject to any disclaimer, the term of this patent is extended or adjusted under 35 U.S.C. 154(b) by 88 days.

(21) Appl. No.: 13/392,348

(22) PCT Filed: Aug. 25, 2010

(86) PCT No.: PCT/JP2010/064375
§ 371 (c)(1),
(2), (4) Date: Feb. 24, 2012

(87) PCT Pub. No.: WO2011/024854
PCT Pub. Date: Mar. 3, 2011

(65) Prior Publication Data
US 2012/0146056 A1    Jun. 14, 2012

(30) Foreign Application Priority Data

Aug. 28, 2009  (JP) ................ 2009-198872

(51) Int. Cl.
*H01L 29/161*  (2006.01)
*H01L 21/20*  (2006.01)

(52) U.S. Cl.
USPC .............. 257/77; 257/E29.084; 257/E21.09; 438/478

(58) Field of Classification Search
USPC .............. 257/77, E29.084, E21.09; 438/478
See application file for complete search history.

(56) References Cited

U.S. PATENT DOCUMENTS

2002/0059898 A1*  5/2002  Landini et al. ............... 117/84
2007/0290211 A1   12/2007  Nakayama et al.

FOREIGN PATENT DOCUMENTS

| CN | 1377311 A | 10/2002 |
| JP | 2005-277229 A | 10/2005 |

(Continued)

OTHER PUBLICATIONS

Research on the electrical properties of SiC epitaxial layer growth and device, paper for master's degree of engineering by Chi-Kwon, Part; Dong-Eui University, 2007.

(Continued)

*Primary Examiner* — Zandra Smith
*Assistant Examiner* — Lawrence Tynes, Jr.
(74) *Attorney, Agent, or Firm* — Sughrue Mion, PLLC

(57) ABSTRACT

Provided is a silicon carbide epitaxial wafer, the entire surface of which is free of step bunching. Also provided is a method for manufacturing said silicon carbide epitaxial wafer. The provided method for manufacturing a silicon carbide semiconductor device includes: a step wherein a 4H—SiC single-crystal substrate having an off-axis angle of 5° or less is polished until the lattice disorder layer on the surface of the substrate is 3 nm or less; a step wherein, in a hydrogen atmosphere, the polished substrate is brought to a temperature between 1400° C. and 1600° C. and the surface of the substrate is cleaned; a step wherein silicon carbide is epitaxially grown on the surface of the cleaned substrate as the amounts of $SiH_4$ gas and $C_3H_8$ gas considered necessary for epitaxially growing silicon carbide are supplied simultaneously at a carbon-to-silicon concentration ratio between 0.7 and 1.2 to 1; and a step wherein the supply of $SiH_4$ gas and the supply of $C_3H_8$ gas are cut off simultaneously, the substrate temperature is maintained until the $SiH_4$ gas and the $C_3H_8$ gas are evacuated, and then the temperature is decreased.

5 Claims, 8 Drawing Sheets

(56) References Cited

FOREIGN PATENT DOCUMENTS

| JP | 2005-311348 A | 11/2005 |
|---|---|---|
| JP | 2006-28016 A | 2/2006 |
| JP | 2006-261612 A | 9/2006 |
| JP | 2008-4888 A | 1/2008 |
| JP | 4238357 B | 3/2009 |

OTHER PUBLICATIONS

Office Action ("Notice of Preliminary Rejection") with a mailing date of Jun. 23, 2013 for corresponding Korean Patent Application No. KR 10-2012-7004757.

M. Treu et al., "Challenges and First Results of SiC Schottky Diode Manufacturing using a 3 inch Technology", Materials Science Forum, 2004, pp. 981-984, vols. 457-460, Trans Tech Publications, Switzerland.

Christian Hecht et al., "Thick epitaxial layers on 4° off-oriented 4H-SiC suited for PiN-diodes with blocking voltages above 6.5 kV", Materials Science Forum, 2006, pp. 239-242, vols. 527-529, Trans Tech Publications, Switzerland.

International Search Report for PCT/JP2010/064375 dated Oct. 5, 2010.

Keiji Wada et al., "Epitaxial growth of 4H-SiC on 4° off-axis (0001) and (0001) substrates by hot-wall chemical vapor deposition", Journal of Crystal Growth 291, 2006, pp. 370-374, Elsevier.

M. Treu et al., "Challenges and First Results of SiC Schottky Diode Manufacturing using a 3 inch Technology", Materials on Science Forum, 2004, pp. 981-984, vols. 457-460, Trans Tech Publications, Switzerland.

Notice of Allowance dated Feb. 21, 2012 for JP Application No. 2009-198872.

S. Nakazawa et al., "High-purity 4H-SiC epitaxial growth by hot-wall chemical vapor deposition", Journal of Crystal Growth 237-239, 2002, pp. 1213-1218, Elsevier.

Office Action with a mailing date of Mar. 5, 2014 for corresponding Chinese Patent Application No. 201080037687.6.

* cited by examiner (a)

(b)

SILICON CARBIDE EPITAXIAL WAFER AND MANUFACTURING METHOD THEREFOR

TECHNICAL FIELD

The present invention relates to a silicon carbide epitaxial wafer and a manufacturing method therefor, and more particularly to a silicon carbide (SiC) epitaxial wafer that is free of step bunching, and a manufacturing method therefor.

Priority is claimed on Japanese Patent Application No. 2009-198872 filed in the Japan Patent Office on Aug. 28, 2009, the contents of which are incorporated herein by reference.

BACKGROUND ART

In response to the problem of global warming, improvements in energy-saving technology have been demanded. Amongst many technical fields, power electronics technology to reduce energy loss during power conversion is of great importance. Although improvements to power electronics have been made regarding the technical performance using related art silicon (Si) semiconductors, performance improvement has reached a limit due to limitations of the material properties of silicon. Therefore, a silicon carbide (SiC) having a greater physical limit than silicon is desirable. In comparison to silicon, silicon carbide has much better physical properties, such as a band gap three times larger, a breakdown electric field strength ten times larger, and a thermal conductivity about three times higher, and is expected to be applied to power devices, high-frequency devices, high-temperature operating devices, and the like.

In order to promote commercialization of SiC devices, it is essential to establish a high-quality crystal growth technology and a high-quality epitaxial growth technology.

Although SiC has many polytypes, 4H—SiC has been mainly used to prepare a practical SiC device. As a substrate of the SiC device, a SiC single-crystal wafer that is machined from bulk crystals prepared by a sublimation method or the like is used, and typically, a SiC epitaxial film that becomes an active region of the SiC device is formed on the substrate by chemical vapor deposition (CVD). In the epitaxial film, a polytype that is different from a polytype used in the substrate is easily contaminated, and for example, in the case of using 4H—SiC in the substrate, 3C—SiC or 8H—SiC is contaminated. In order to suppress such contamination, epitaxial growth is generally performed by performing step flow growth (lateral growth of atomic steps) in a state where the SiC single-crystal substrate is tilted slightly.

<Step Bunching and Observation/Evaluation Thereof>

In the case where the SiC substrate has a size up to about 2 inches, an angle of 8° has been mainly used as the slight tilting angle (off-angle). In this off-angle, the terrace width of the wafer surface is small, and step flow growth can be easily obtained. However, as the off-angle becomes larger, fewer numbers of wafers are obtained from the SiC ingot. Because of this, in the SiC substrate of 3 inches or more, an off-angle of about 4° has been mainly used from the viewpoint of cost reduction. Since the terrace width of the wafer surface at the off-angle of about 4° is twice the terrace width at the off-angle of about 8°, variations tend to occur in the velocity of migration of atoms that are taken into the step edge, that is, in the growth rate of the step edge. As a result, a step having a high growth rate catches up with a step having a low growth rate, causing coalescence, and thus step bunching occurs. Particularly, in the case where the epitaxial surface is the Si surface, the migration of surface atoms is suppressed as compared with the C surface, and thus step bunching occurs easily. Here, step bunching means a phenomenon in which atom steps (typically 2 to 10 atom layers) are gathered, causing coalescence on the surface, and may indicate a step height of the surface itself. NPL 1 shows a typical step bunching.

In the related art, observation and evaluation of step bunching have been often performed by combination of an optical microscope, such as a differential interference microscope, and an atomic force microscope (AFM) with atomic resolution (for example, NPL 1 and NPL 2).

<Gas Etching and Supply of Raw Material Gas>

When forming a SiC epitaxial film on a SiC single-crystal substrate, in the related art, chemical-mechanical polishing (CMP) and gas etching are performed in order after performing mechanical polishing, surface treatment of the SiC single-crystal substrate is performed, and then the SiC epitaxial film is formed by a chemical vapor deposition method. The gas etching is performed mainly by using hydrogen gas at a high temperature of about 1500° C. as pretreatment for removal of damage or polishing marks (scratches) due to the polishing process and surface flattening.

The gas etching is performed with the addition of propane ($C_3H_8$) gas that is a raw material gas of the SiC epitaxial film in a hydrogen atmosphere (PTL 1, paragraph [0002] of PTL 2, and NPL 3). As shown in NPL 3, although the hydrogen gas etching is required in order to obtain a good epitaxial surface, it appears that Si droplets occur when only hydrogen is used, and with the addition of $C_3H_8$, it is considered that the occurrence of Si droplets can be suppressed.

However, if damage or polishing marks (scratches) due to polishing remain on the substrate surface after gas etching, different polytypes, dislocations, or stacking defects are introduced into the epitaxial film formed on the substrate surface thereafter. In order to avoid this, if the etching amount is increased too much through extending of the gas etching time, surface reconstruction occurs at the substrate surface, and step bunching occurs on the substrate surface before the start of epitaxial growth.

In order to suppress the occurrence of step bunching, as a method for decreasing the etching amount, a method of performing gas etching with the addition of silane ($SiH_4$) gas, which is a raw material gas, into hydrogen gas has been proposed (PTL 2).

In any method of PTL 1 and PTL 2, although gas etching is performed with the addition of $C_3H_8$ gas or $SiH_4$ gas, which is a raw material gas of the SiC epitaxial film, the SiC epitaxial film is deposited with the introduction of another gas directly following the gas etching, without exhausting the added gas (FIG. 2 of PTL 1, and FIG. 4 of PTL 2). That is, before the start of the SiC epitaxial film growth, the propane ($C_3H_8$) gas or the silane ($SiH_4$) gas is already present on the surface of the SiC substrate.

As described above, in the commonly performed method at present, which is represented by PTL 1 and PTL 2, the propane ($C_3H_8$) gas and the silane ($SiH_4$) gas, which are raw material gases, are not simultaneously supplied when the growth of the SiC epitaxial film starts.

CITATION LIST

Patent Literature

[PTL 1] Japanese Patent No. 4238357
[PTL 2] Japanese Unexamined Patent Application Publication No. 2005-277229

Non-Patent Literature

[NPL 1] Mater. Sci. Forum 527-529, (2006) pp. 239-242
[NPL 2] Journal Cryst. Growth 291, (2006) pp. 370-374
[NPL 3] Journal Cryst. Growth 237-239, (2002) pp. 1213-1218

SUMMARY OF INVENTION

Technical Problem

Although the atomic arrangement of the surface cannot be directly observed through the AFM with atomic resolution, the maximum observation range thereof is about 10 to 20 μm square, and more extensive measurement is difficult due to the AFM mechanism. However, since it has been recognized that step bunching of the SiC epitaxial film surface is continuous from one end to another end of the wafer, by combining the AFM with an optical microscope, the mechanical disadvantage of the AFM is is not considered particularly inconvenient.

Further, in NPL 2, a differential interference microscope is used in observing a range of about 200 μm to 1 mm square, which is wider than the range of the AFM. However, in the differential interference microscope, the height of the step is unable to be quantified, and particularly, in the case of high magnification, there is a disadvantage of being unable to detect the step having a height of several nm.

Since step bunching prevents the flattening of the surface of the SiC epitaxial film, suppressing the occurrence of such step bunching is required for high performance of the SiC device. Since the step bunching is a step height of the surface, its presence may be a fatal impact on operating performance and reliability, especially in a MOSFET (Metal-Oxide-Semiconductor Field Effect Transistor) in which an oxide film is formed on the surface of a SiC epitaxial film and its interface is energized. Because of this, the study of suppression of step bunching has been intensively performed in the related art.

The active region of the SiC power device including the MOSFET is larger than the measurement range of the typical AFM. Accordingly, in order to obtain an epitaxial growth surface that makes it possible to produce a device having superior characteristics, the evaluation by the typical AFM or differential interference microscope may not be sufficient.

Further, as described above, it is general to perform gas etching with the addition of $C_3H_8$ gas or $SiH_4$ gas, which is a raw material gas, and thereafter, the SiC epitaxial film is deposited with the introduction of another gas directly following the gas etching, without exhausting the added gas. In this case, the supply of the raw material gas to the substrate surface is not simultaneously performed. Although the etching may be performed only with hydrogen gas, the importance of simultaneous supply of the raw material gas onto the substrate surface has not been recognized.

<Short Step Bunching>

The inventors observed and evaluated the SiC epitaxial wafer that was considered to suppress step bunching in the related art method using a combination of an optical surface inspection device, which had a similar sensitivity to the AFM in a height direction, used laser light, and could observe a more extensive range than the differential interference microscope, and an extensive observation type AFM (hereinafter also referred to as "extensively observing AFM"), and found that step bunching that was difficult to ascertain through the typical AFM or differential interference microscope was present as a standard state of the surface.

Such newly revealed step bunching is present at an average interval of about 100 μm, and has a length of 100 to 500 μm in [1-100] direction. Further, as described later, step bunching occurs due to a step height which is formed on the surface due to shallow pits that are formed as screw dislocation appears on the growth surface. Since screw dislocation is included in the SiC single-crystal substrate used as the substrate of the epitaxial growth film, it may be caused by the substrate.

On the other hand, the existing step bunching in the related art (hereinafter also referred to as a "related art step bunching") is present at an average interval of about 1.5 μm, and has a length of 5 mm or more in the [1-100] direction (in the description, in the notation of Miller indices, "-" means a bar for the index immediately after the bar. Further, step bunching in the related art occurs by the following mechanism. Since there is an off-angle on the surface of the SiC single-crystal substrate, a corresponding atomic step is present on the surface. This atomic step moves in the process of epitaxial growth or gas etching. If there is a difference in moving speed between the steps, such steps coalesce and the related art step bunching occurs regardless of dislocations in the substrate.

In the present description, the newly revealed step bunching is also described as "short step bunching" in contrast to the related art step bunching.

FIG. 1 shows an AFM image (three-dimensional perspective image of the surface) of 10 μm square of the surface of the SiC epitaxial wafer that is observed by a typical AFM (Dimension V manufactured by Veeco Instrument). FIG. 1(a) is an AFM image that indicates the related art step bunching, and FIG. 1(b) is an AFM image that indicates short step bunching.

In the case where the AFM image as illustrated by an arrow A in FIG. 1(b) is obtained or a part of the AFM image is obtained by reciprocating scanning of a cantilever several times rather than scanning of one screen, it is determined as noise or it is determined that a region with a specific condition is observed rather than it being determined that the standard state of the surface is shown, and it is usual to move to another area for observation. Accordingly, although it can be said that short step bunching would have been observed through the typical AFM or differential interference microscope, it is not recognized that short step bunching indicates at least the standard state of the surface of the SiC epitaxial film.

FIG. 2 shows an AFM image of 200 μm square on the surface of a SiC epitaxial film that is observed by an extensive observation type AFM (nanoscale hybrid microscope VN-8000 manufactured by Keyence) used in the present invention.

FIG. 2(a) shows an AFM image that indicates the related art step bunching, and FIG. 2(b) shows an AFM image that indicates short step bunching.

As shown in FIG. 2(a), it can be observed that the related art step bunching, in the same manner as a typical AFM image, is present at an average interval of about 1.5 μm. In FIG. 2(b), it can be seen that two lines (indicated by arrows B and C) are stably observed at a constant separation. The fact that the step can be stably observed in an extensive range of 200 μm square as described above confirms that the step does not indicate simply noise or a specific surface area, but does indicate the presence of step bunching having different properties from the related art step bunching.

In order to confirm the presence of short step bunching through another surface inspection device, observation was performed through an optical surface inspection device (Candela CS20 manufactured by KLA-Tencor Corporation) using laser light. Since this optical surface inspection device has a measuring range that is larger than the entire surface of a wafer of several μm square to 4 inches or more and the extensive observation type AFM, it is also suitable for measuring the density of short step bunching.

An optical surface inspection device (a device that performs surface inspection by the same principle as the Candela CS20 manufactured by KLA-Tencor Corporation) used in the present invention has features of having a system for making laser light incident at an angle to the wafer and detecting intensity of scattered light from the wafer surface, intensity of reflected light and a reflection position. The wafer surface is spirally scanned. Since the reflection position is changed to trace the unevenness of the wafer surface, the roughness (surface roughness) can be calculated from this position information. In order to extract the surface roughness information in a period corresponding to the step bunching, a filter of 100 µm is used during the calculation, and information on long-period undulation of the wafer surface is removed.

However, since the step bunching is in parallel to a [1-100] direction, the step is not detected in an area where the laser light and the scanning direction are in parallel to each other in a spiral scan. Because of this, in calculating the roughness information, ranges of 70°, that is, ranges of 55° to 125° and 235° to 305°, are selected in typical polar coordinates. Further, since the center of the spiral scan becomes a singular point at which most of the laser light is not working, the position information of the reflected light in the vicinity thereof does not reflect the roughness. Because of this, the range of φ 10 mm of the center is excluded from the calculation region. Although the set calculation range as described above is about 35% of the entire surface of the wafer, a morphology in this range, with respect to the step bunching, reflects almost the entire surface of the wafer. The calculated roughness has a correlation with the roughness measured using the AFM, and is in accordance with the actual surface morphology.

<Origin of Occurrence of Short Step Bunching>

FIG. 3 shows the result of observation of a SiC epitaxial wafer on which short step bunching is observed in an optical surface inspection device through a differential interference microscope. As indicated by an arrow, significant shallow pits and their associated short step bunching can be confirmed. From this, the depth of the shallow pits on the epitaxial layer surface is found to be 6.3 nm.

FIG. 4 shows the result of observation through a differential interference microscope after performing KOH etching in order to confirm the origin of the shallow pits. As partially indicated by arrows, the presence of screw dislocation and its associated short step bunching can be confirmed. From this, it can be reasoned that the short step bunching occurs as a result of inhibition of the step-flow growth caused by the step height of the shallow pits that occur on the surface. As described above, it can be understood that the origin of occurrence of short step bunching corresponds to shallow pits due to the screw dislocation in the epitaxial layer inherited from the substrate.

As described above, the inventors found that short step bunching was not a peculiar state of the surface, but was present as the standard state by observing and evaluating the surface of the SiC epitaxial film through combination of the optical surface inspection device and the so-called extensive observation type AFM, which is a surface inspection device that is different from that in the related art. Further, as a result of extensive studies, the inventors identified the origin of the short step bunching, suppressed the occurrence thereof, and realized a method of manufacturing a step bunching-free SiC epitaxial wafer.

It is considered that the presence of this short step bunching is one of the primary causes of quality variation.

Further, the inventors found the importance of simultaneous supply of $SiH_4$ gas and $C_3H_8$ gas in the amount required for epitaxial growth of silicon carbide on the surface of the SiC single-crystal substrate in depositing the SiC epitaxial film.

The present invention has been made in view of the above-described problems, and an object of the invention is to provide a step bunching-free SiC epitaxial wafer that has no step bunching on the entire surface of a wafer and a manufacturing method thereof.

The inventors started to find step bunching which had a different origin from the related art step bunching and was caused by a SiC substrate, and first found the necessary conditions in a polishing process of the substrate in order to prevent the occurrence of step bunching caused by the substrate. Further, the inventors prepared a SiC single-crystal substrate by performing gas etching on the SiC single-crystal substrate polished under the above-described conditions, performed deposition by simultaneously supplying $SiH_4$ gas and $C_3H_8$ gas in the amount required for epitaxial growth of silicon carbide using the SiC single-crystal substrate onto the substrate surface in a predetermined concentration ratio, maintained the substrate temperature until the gas was removed by simultaneously cutting off the supply of the gas, and then decreased the temperature to obtain a step bunching-free SiC epitaxial wafer.

In order to suppress the contamination of the polytype that is different from the polytype used in the substrate, the epitaxial growth is performed by performing step flow growth (lateral growth of atomic steps) in a state where the SiC single-crystal substrate is tilted slightly. In general, by setting the tilting angle to 0.4° or more, the step edge is out on the growth surface, and the step-flow is grown. In the present invention, it is preferable that the tilting angle be 0.4° or more.

The present invention is effective in the case where the substrate has a low off-angle of 5° or less, at which step bunching is liable to occur. The effect of the present invention is effective at the tilting angles in the range of 0.4° to 5°, and is particularly effective in the case of the tilting angle of 2° or more since the terrace width on the substrate is narrow and the step-flow growth is promoted to facilitate obtaining a mirror surface.

Although a generally sold 4°-off substrate has the standard range of tilting angle of 3.5° to 4.5°, the present invention is particularly effective with respect to the 4°-off substrate having this range of tilting angle. The 4°-off substrate is low-priced due to lower loss if it is cut from a single crystal in comparison to an 8°-off substrate, which is a standard product used in the related art, since it is easy to obtain a mirror surface. Because of this, by applying the technology of the present invention to the 4°-off substrate, an epitaxial wafer which has a good quality and is low-priced can be obtained.

The present invention provides the following means.

(1) A SiC epitaxial wafer obtained by forming a SiC epitaxial layer on a 4H—SiC single-crystal substrate that is tilted at an off-angle of 0.4° to 5°, wherein when a surface of the SiC epitaxial wafer layer is measured by an optical surface inspection device that uses laser light, mean-square roughness Rq of the surface is 1.3 nm or less.

In the present invention, the "optical surface inspection device using laser light" means a device that inspects the surface by the same principle as the Candela CS20 manufactured by KLA-Tencor Corporation.

(2) A SiC epitaxial wafer obtained by forming a SiC epitaxial layer on a 4H—SiC single-crystal substrate that is tilted at an off-angle of 0.4° to 5°, wherein when a surface of the SiC epitaxial wafer layer is measured by an atomic force microscope, mean-square roughness Rq of the surface is 1.0 nm or less and a maximum height difference Ry is 3.0 nm or less.

(3) The SiC epitaxial wafer as described in any one of preceding paragraphs (1) and (2), wherein a linear density of steps of the epitaxial layer surface of the wafer is 5 $mm^{-1}$ or less.

(4) The SiC epitaxial wafer as described in the preceding paragraph (3), wherein the steps are connected to shallow pits due to screw dislocation in the SiC epitaxial layer.

(5) A method of manufacturing a SiC epitaxial wafer including the steps of polishing a 4H—SiC single-crystal substrate that is tilted at an off-angle of 0.4° to 5° until a lattice disorder layer of a surface thereof becomes 3 nm or less; cleaning the surface of the substrate after polishing at 1400 to 1600° C. in a hydrogen atmosphere; performing epitaxial growth of silicon carbide on the surface of the substrate after the cleaning by simultaneously supplying $SiH_4$ gas and $C_3H_8$ gas in the amount required for the epitaxial growth of the silicon carbide at a carbon-to-silicon (C/Si) concentration ratio of 0.7 to 1.2; and simultaneously cutting off the supply of the $SiH_4$ gas and the $C_3H_8$ gas, maintaining the substrate temperature until the $SiH_4$ gas and the $C_3H_8$ gas are exhausted, and then decreasing the temperature.

In the present invention, on the surface of the substrate of which the temperature has been raised, adsorption (sublimation) and desorption (growth) of Si and C from/into the substrate occur simultaneously, and the case where adsorption is more than desorption (adsorption>desorption) corresponds to gas etching, and the case where adsorption is less than desorption (adsorption<desorption) corresponds to growth. However, in the case of adding the $SiH_4$ gas and/or the $C_3H_8$ gas during gas etching (cleaning process) (next paragraph (6)), the amount of raw material gas is small, and thus dominant gas etching occurs even if the raw material gas is added. Accordingly, the "amount required for the epitaxial growth of the silicon carbide" is an expression that is used to clarify the difference in meaning between the supply amounts of $SiH_4$ gas and/or $C_3H_8$ gas during the gas etching.

Further, in the present invention, "simultaneous supply" does not mean exactly at the same time, but means supply with a difference of a few seconds. In the device shown in embodiments to be described hereinafter, if the time difference between the supply of $SiH_4$ gas and the supply of $C_3H_8$ gas was set to be within five seconds, the occurrence of step bunching could be suppressed. Although the mechanism involved in how the simultaneous supply is related to the occurrence of step bunching is unknown, it is presumed that the mechanism is related to spatial concentration distribution of two kinds of raw material gas in the initial period of deposition. Since this spatial concentration distribution of the raw material gas also depends on the shape and configuration of the device, specific values of the permissible supply time difference cannot be stated. However, those skilled in the art can find the time difference allowed by the simultaneous supply according to the present invention through investigation of the occurrence of step bunching in a few seconds difference.

(6) The method of manufacturing a SiC epitaxial wafer as described in the preceding paragraph (5), wherein the cleaning step is performed by addition of $SiH_4$ gas and/or $C_3H_8$ gas in a hydrogen atmosphere, and the step of performing epitaxial growth is initiated after the added gases are exhausted.

Advantageous Effects of Invention

According to the above-described configuration, a step bunching-free SiC epitaxial wafer can be provided.

BRIEF DESCRIPTION OF DRAWINGS

FIG. 1 shows an image obtained by observing step bunching of a SiC epitaxial wafer surface through a typical AFM, in which FIG. 1(a) shows an image of the related art step bunching, and FIG. 1(b) shows an image of short step bunching.

FIG. 2 shows an image obtained by observing step bunching of a SiC epitaxial wafer surface through an extensive observation type AFM, in which FIG. 1(a) shows an image of the related art step bunching, and FIG. 1(b) shows an image of short step bunching.

FIG. 5 shows an image obtained by observing a SiC epitaxial wafer surface through an extensive observation type AFM, in which FIG. 5(a) shows an image indicating a SiC epitaxial wafer according to the present invention and FIG. 5(b) shows an image indicating the related art SiC epitaxial wafer.

FIG. 6 shows an image obtained by observing a SiC epitaxial wafer surface through an optical surface inspection device using laser light, in which FIG. 6(a) shows an image indicating a SiC epitaxial wafer according to the present invention and FIG. 6(b) shows an image indicating the related art SiC epitaxial wafer.

DESCRIPTION OF EMBODIMENTS

Hereinafter, a SiC epitaxial wafer and a manufacturing method thereof according to embodiments of the present invention will be described in detail using the accompanying drawings.

[SiC Epitaxial Wafer]

Figure 1:
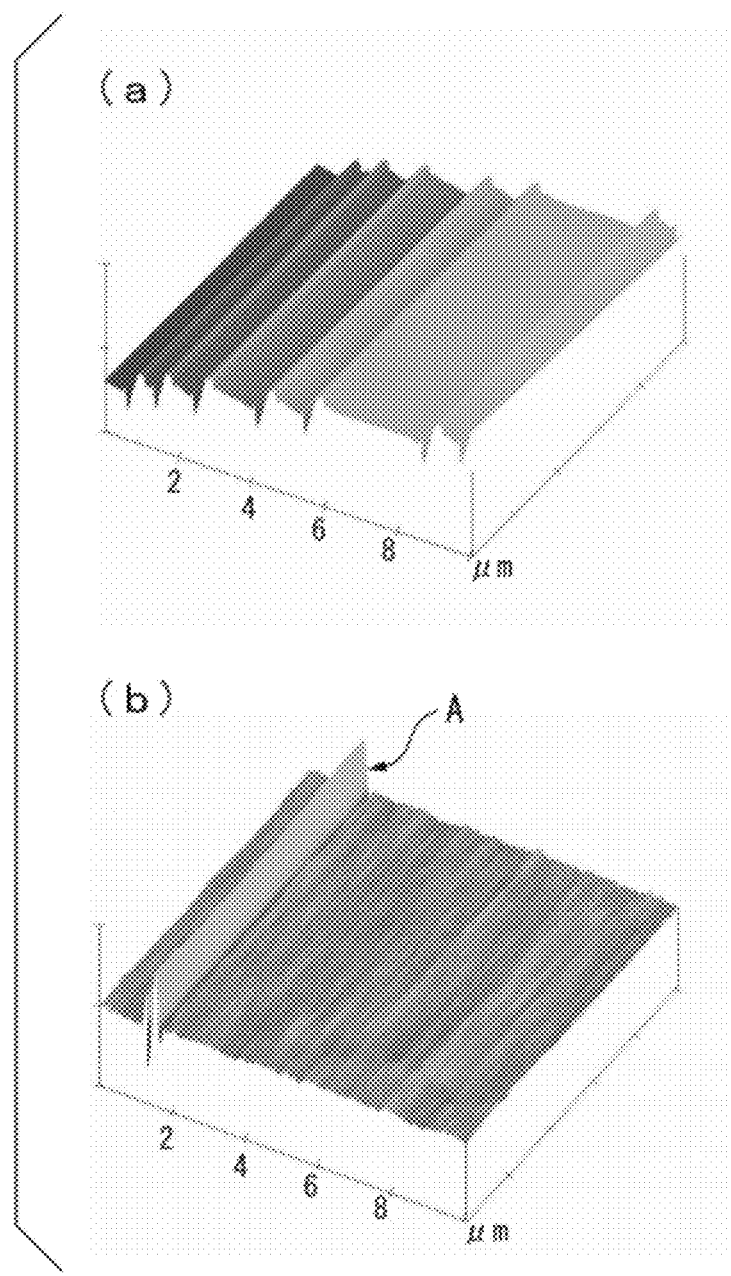
Figure 2:
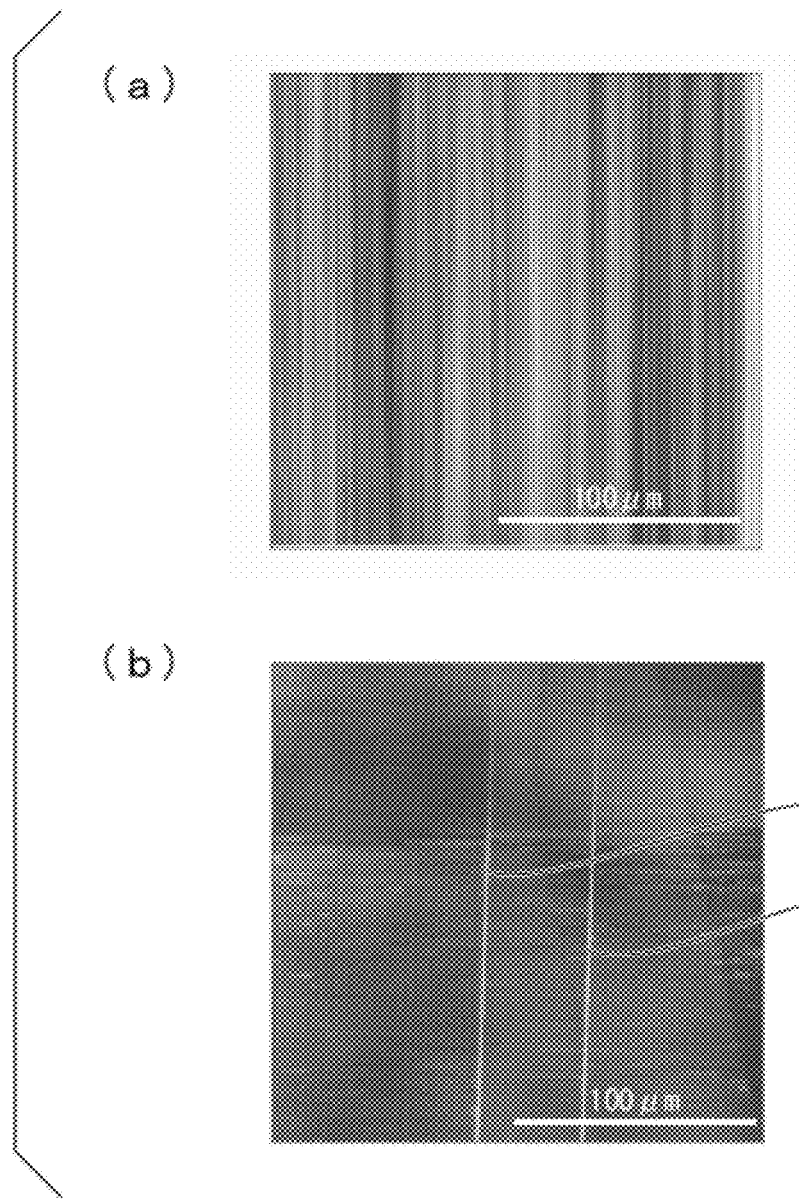
Figure 3:
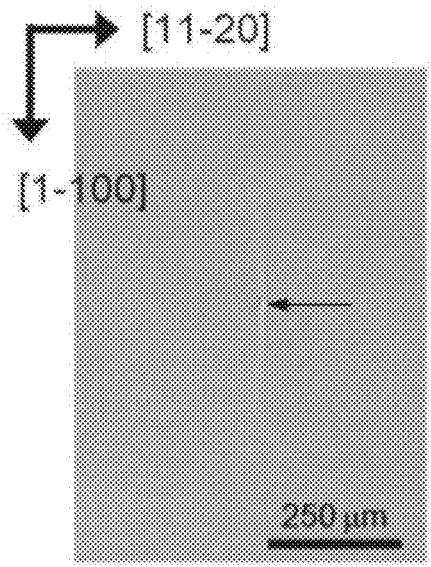
FIG. 3 shows an image obtained by observing a SiC epitaxial wafer including short step bunching through a differential interference microscope.
Figure 4:
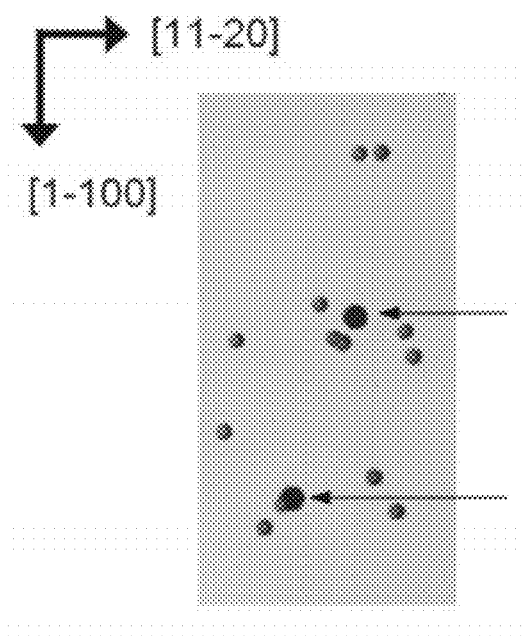
FIG. 4 shows an image obtained by observing a wafer used in FIG. 3 after KOH etching through a differential interference microscope.
Figure 5:
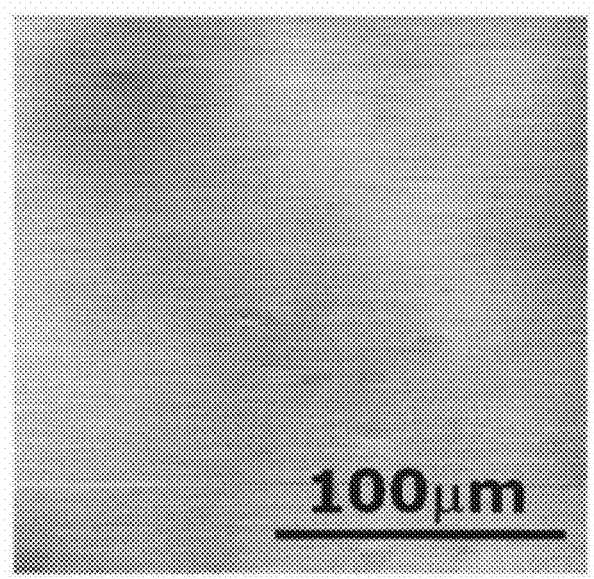
Figure 5:
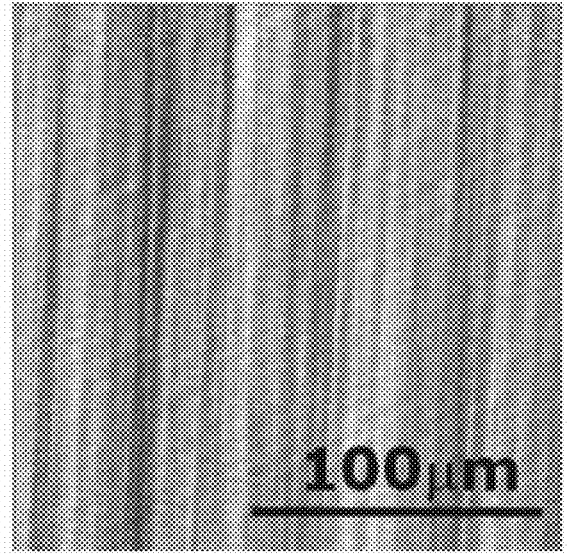
Figure 6:
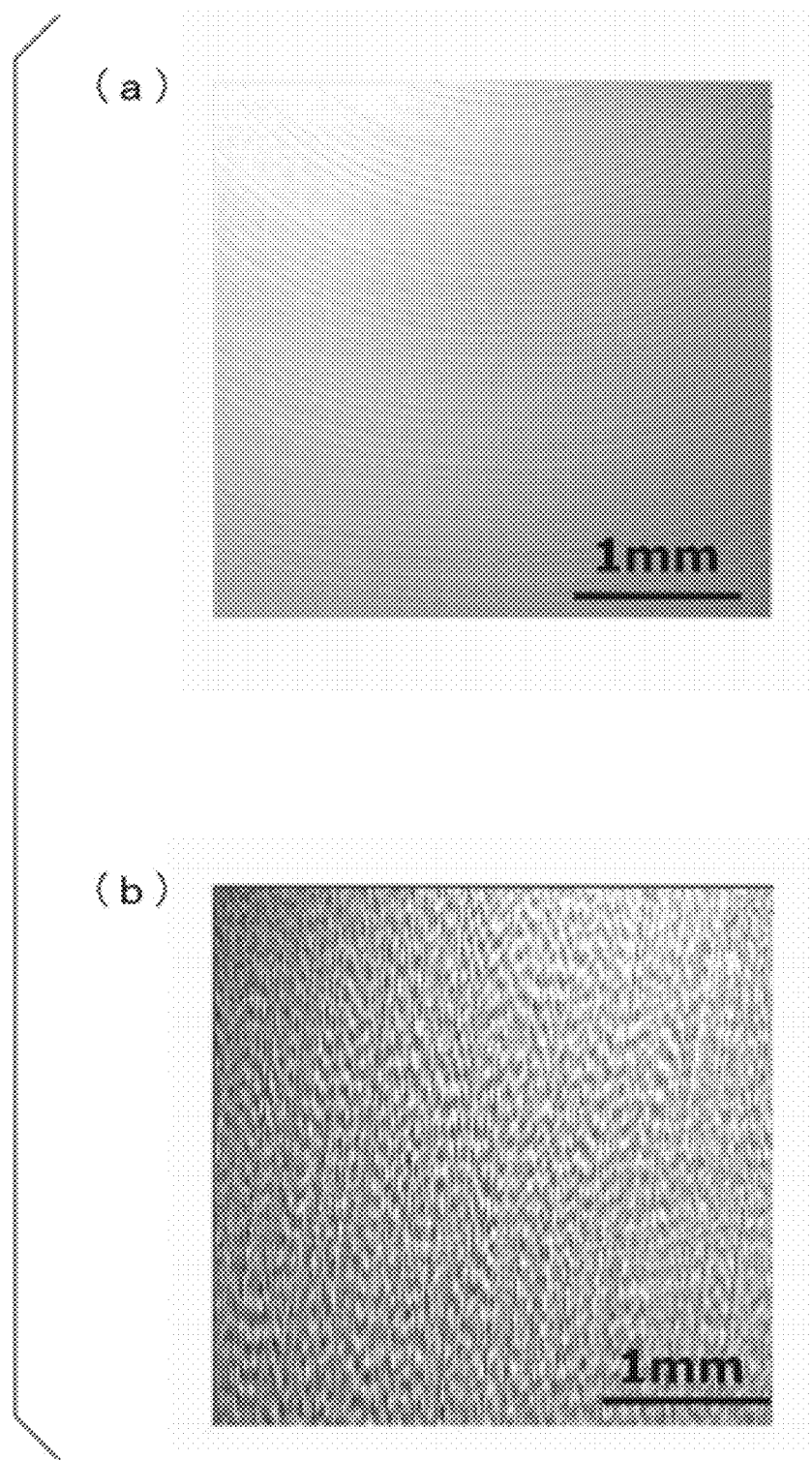

FIGS. 5 and 6 show the results of observing a SiC epitaxial wafer, which is obtained by forming a SiC epitaxial layer on a 4H—SiC single-crystal substrate that is tilted at an off-angle of 4°, according to an embodiment of the invention through an extensive observation type AFM and an optical surface inspection device (Candela CS20 manufactured by KLA-Tencor Corporation) using laser light.

FIG. 5(a) shows an extensive observation type AFM image of 200 μm square on the surface of the SiC epitaxial wafer according to the present invention. Further, FIG. 5(b) shows an extensive observation type AFM image of 200 μm square on the surface of the related art SiC epitaxial wafer.

On the SiC epitaxial wafer according to the present invention, no step was observed (linear density of step was 0 piece/$mm^{-1}$). Even in other areas of this sample, almost no step was observed. Accordingly, it was found that a step bunching-free SiC epitaxial wafer was realized and the linear density of the step was 5 $mm^{-1}$ or less. Further, the mean-square roughness Rq of the surface was 0.4 nm, and the maximum height difference Ry was 0.7 nm. The average Rq of three areas randomly selected in the same sample was 0.52 nm, and the average Ry was 0.75 nm. Accordingly, it was found that the mean-square roughness Rq of the observed surface was 1.0 nm or less, and the maximum height difference Ry was 3.0 nm or less.

By contrast, in the related art SiC epitaxial wafer, step bunching in which many steps were coalesced with a linear density of 340 pieces/mm$^{-1}$ was observed. The average step line density of three other areas in this sample was 362 pieces/mm$^{-1}$. Further, steps could be seen extending beyond the observation range.

Further, the mean-square roughness Rq of the surface was 2.4 nm, and the maximum height difference Ry was 3.6 nm. The average Rq of three areas randomly selected in the same sample was 3.2 nm, and the average Ry was 4.5 nm.

FIGS. 6(a) and 6(b) show images (hereinafter also referred to as "Candela images") observed by the optical surface inspection device using laser light with respect to 1 mm square range of the same sample of FIGS. 5(a) and 5(b).

According to the SiC epitaxial wafer according to the present invention, the mean-square roughness Rq of the observed surface was 1.2 nm. Accordingly, it was found that the mean-square roughness Rq was 1.3 nm or less.

By contrast, in the related art SiC epitaxial wafer, the mean-square roughness Rq was 1.7 nm, and thus it can be seen that there are obvious differences in surface flatness between the SiC epitaxial wafer according to the present invention and the related art SiC epitaxial wafer.

[Method of Manufacturing a SiC Epitaxial Wafer]

Hereinafter, a method of manufacturing a SiC epitaxial wafer according to an embodiment of the invention will be described in detail.

<Polishing Process>

In a polishing process, a 4H—SiC single-crystal substrate was polished until the lattice disorder layer of the surface became 3 nm or less.

In the description, the "lattice disorder layer" means a layer on which a banded structure that corresponds to an atomic layer (lattice) of SiC signal-crystals or part of its stripes is not clear with respect to the lattice image (image in which the lattice can be confirmed) of the TEM.

Figure 7:
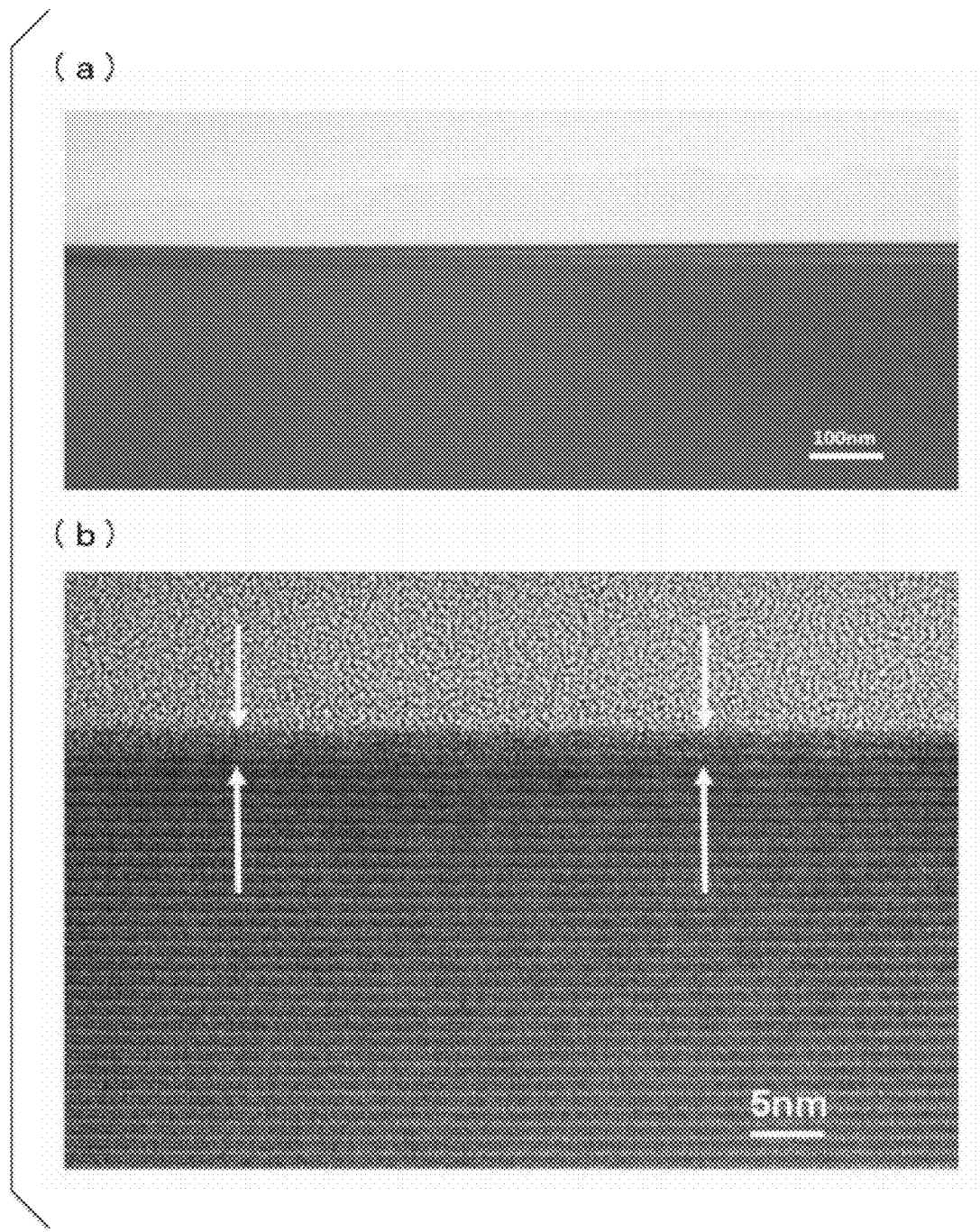
FIG. 7(a) shows an image obtained by observing the cross-sectional surface of a SiC single-crystal substrate according to the present invention through a transmission electron microscope.
FIG. 7(b) shows an enlarged image of FIG. 7(a).
Figure 8:
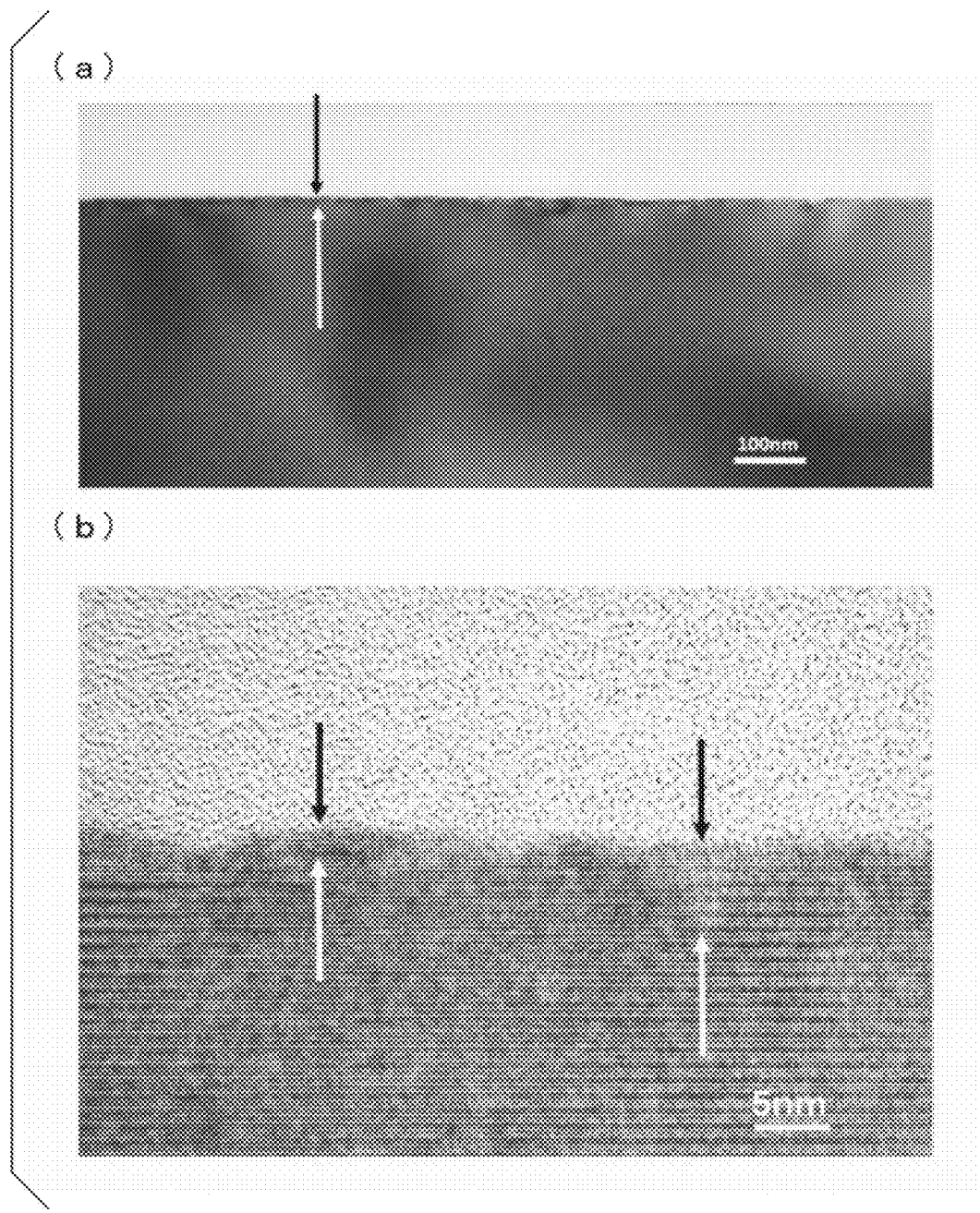
FIG. 8(a) shows an image obtained by observing the cross-sectional surface of a SiC single-crystal substrate in the related art through a transmission electron microscope.
FIG. 8(b) shows an enlarged image of FIG. 8(a).

First, in order to explain the presence and characteristics of the "lattice disorder layer", FIGS. 7 and 8 show transmission electron microscope (TEM) images in the vicinity of the surface of the SiC single-crystal substrate after the polishing process.

FIGS. 7(a) and 7(b) show TEM images indicating an example of the SiC single-crystal substrate according to the present invention.

In the TEM image shown in FIG. 7(a), the disorder of the flatness of the surface cannot be observed. Further, in the lattice image (FIG. 7(b)) that is the enlarged image thereof, the disorder is observed only in the uppermost atomic layer (lattice), and a clear banded structure can be observed from the atomic layer (lattice) below the uppermost atomic layer. The layer sandwiched by arrows is the "lattice disorder layer".

From this TEM image, it can be confirmed that the "lattice disorder layer" is 3 nm or less.

FIGS. 8(a) and 8(b) show TEM images indicating an example of a SiC single-crystal substrate that is present on the surface of the lattice disorder layer of 3 nm or more.

In the TEM image shown in FIG. 8(a), the disorder of the surface flatness is apparently observed, and even in a flat-looking part of FIG. 8(a) and in the lattice image (FIG. 8(b)) that is the enlarged image thereof, the disorder of the banded structure can be observed over 6 nm or more from the surface.

In this TEM image, the "lattice disorder image" (the layer sandwiched by arrows on the right side of the image) of about 7 nm can be observed, and in this sample, it is shown that the "lattice disorder layer" of the surface of 3 nm or less is not achieved.

Hereinafter, embodiments of this process will be described.

The polishing process may include plural polishing processes, such as rough polishing that is usually referred to as a lap, precision polishing called polish, and chemical-mechanical polishing (hereinafter referred to as "CMP") that is ultra-precision polishing. Although the polishing process is often carried out in a wet state, which is common in this process, the polishing was done by pressing a polishing head, to which a silicon carbide substrate is attached, onto a rotating plate, to which polishing cloth is affixed, as supplying polishing slurry. Although the polishing slurry used in the present invention is basically used in such a form, the form of the polishing slurry does not matter if wet polishing using the polishing slurry is performed.

Particles used as polishing particles may be particles that are dispersed without being dissolved in this pH region. In the present invention, it is preferable that the pH of a polishing liquid be less than 2, and in this case, diamond, silicon carbide, aluminum oxide, titanium oxide, silicon oxide, and the like, may be used as abrasive particles. In the present invention, the average diameter of the abrasive particle is 1 to 400 nm, preferably 10 to 200 nm, and more preferably 10 to 150 nm. In order to obtain good surface finishing, silica is preferable from the viewpoint that it is commercially available, inexpensive, and has a small particle size. More preferably, colloidal silica is used. The particle size of the abrasive, such as colloidal silica, may be appropriately selected depending on the processing characteristics, such as processing speed, surface roughness, and the like. If a higher polishing rate is required, an abrasive having a large particle size may be used. In the case where a surface having small surface roughness, that is, a highly smooth surface, is required, an abrasive having a small particle size may be used. An abrasive having an average particle size that exceeds 400 nm is expensive and uneconomical, and the polishing rate is not relatively high. Extremely small particle size, of less than 1 nm, significantly reduces the polishing rate.

The addition amount of abrasive particles is 1 wt % to 30 wt %, and preferably 1.5 wt % to 15 wt %. If the addition amount exceeds 30 wt %, the drying rate of the abrasive particles becomes faster, scratches increase, and the abrasive becomes uneconomical. Further, if the addition amount of the abrasive particles is less than 1 wt %, the processing speed becomes too low, and thus it is undesirable.

In the present invention, the abrasive slurry is water-based abrasive slurry, and the pH at 20° C. is less than 2.0, preferably less than 1.5, and more preferably less than 1.2. In a region where the pH is 2.0 or more, a sufficient polishing rate cannot be obtained. On the other hand, by making the slurry less than pH 2, the chemical reactivity of silicon carbide increases significantly even in a typical indoor environment, and ultra-precision polishing becomes possible. The silicon carbide is not directly removed by mechanical action of the oxide particles in the abrasive slurry, but the abrasive liquid performs chemical reaction of silicon oxide on the silicon carbide single-crystal surface, and the abrasive particles eliminate the silicon oxide by mechanical action. Accordingly, it is very important to make the abrasive liquid composition as a liquid on which the silicon carbide is liable to react, that is, to make the pH less than 2, and to select oxide particles having moderate hardness as abrasive particles in order to obtain a smooth surface without scratches or damaged layers.

The abrasive slurry is adjusted so that the pH becomes less than 2 using at least one acid, and preferably, two or more acids. The acid is preferably an inorganic acid, and the inorganic acid is preferably hydrochloride, nitrate, phosphate, or sulfate. Although it is unclear why the use of plural acids is effective, it has been confirmed by experiments, and there is a possibility that plural acids interact to heighten the effect. As the addition amount of acids, for example, an appropriate type and quantity are selected in the range of 0.5 to 5 wt % of sulfate, 0.5 to 5 wt % of phosphate, 0.5 to 5 wt % of nitrate, and 0.5 to 5 wt % of hydrochloride, and the pH is determined to be less than 2.

The inorganic acid is effective since it is a strong acid compared with an organic acid, and it is extremely favorable in adjusting a predetermined strongly acidic abrasive liquid. The use of an organic acid is accompanied with difficulties in adjustment of the strongly acidic abrasive liquid.

The polishing of the silicon carbide is performed so that the oxide layer is removed by oxide particles through the reactivity of the oxide film formed on the surface of the silicon carbide by the strongly acidic abrasive liquid. And by adding an oxidizing agent to the abrasive slurry in order to accelerate the surface oxidization, the effect is seen even better. The oxidizing agent may be hydrogen peroxide, perchloric acid, potassium dichromate, or persulfate ammonium sulfate. For example, by adding 0.5 to 5 wt %, and preferably 1.5 to 4 wt % of hydrogen peroxide solution, the polishing rate is improved. However, the oxidizing agent is not limited to the hydrogen peroxide solution.

In order to suppress the gelation of the abrasive, an anti-gelling agent may be added to the abrasive slurry. As the types of anti-gelling agents, phosphate-based ester chelating agents, such as 1-hydroxyethylidene-1, 1-diphosphonate, and amino triethylene phosphonic acid, are suitably used. The anti-gelling agent is added in the range of 0.01 to 6 wt %, and preferably 0.05 to 2 wt %.

In order to form the lattice disorder layer on the surface at 3 nm or less in the polishing process according to the present invention, it is preferable to set the processing pressure to 350 g/cm$^2$ or less in the mechanical polishing before the CMP, and to suppress the damage layer to 50 nm using abrasive particles having a diameter of 5 μm or less. Further, in the CMP, it is preferable that the abrasive slurry include abrasive particles having an average particle diameter of 10 nm to 150 nm and an inorganic acid, and the pH at 20° C. is less than 2. It is more preferable that the abrasive particles be silica, and 1 wt % to 30 wt % thereof be included, and it is further more preferable that the inorganic acid be at least one of hydrochloride, nitrate, phosphate, and sulfate.

<Cleaning (Gas Etching) Process>

In the cleaning process, the surface of the substrate after the polishing is cleaned (gas etching) at 1400 to 1600° C. under a hydrogen atmosphere.

Hereinafter, an embodiment of this process will be described.

The gas etching is performed for 5 to 30 minutes with a pressure of 100 to 250 mbar and oxygen gas flow of 40 to 120 slm in a state where the SiC single-crystal substrate is maintained at 1400 to 1600° C.

After cleaning the SiC single-crystal substrate after polishing, the substrate is set in the epitaxial growth device, for example, in a plural-piece planetary type CVD device. After introducing a hydrogen gas into the device, the pressure is adjusted to 100 to 250 mbar. Thereafter, the substrate temperature is set to 1400 to 1600° C., and preferably 1480° C. by raising the temperature of the device, and the gas etching of the substrate surface is performed by hydrogen gas for 1 to 30 minutes. In the case of performing the gas etching with the hydrogen gas under such conditions, the etching amount becomes about 0.05 to 0.4 μm.

It is considered that the substrate surface is damaged by the polishing process, and in the TEM, not only the damage that can be detected as the "lattice disorder layer" but also lattice distortion that cannot be detected by the TEM is present more deeply. The gas etching is performed to remove the above-described damaged layer (hereinafter also referred to as a "damaged layer"). However, if the gas etching is insufficient and the damaged layer remains, different polytypes, dislocations, and stacking defects are introduced into the epitaxial growth layer. Further, if too much etching is performed, surface reconstruction occurs on the substrate surface, and step bunching occurs before the start of the epitaxial growth. Due to this, it is important to optimize the damaged layer and the gas etching amount, and the inventors found that a combination of the damaged layer when the lattice disorder layer of the substrate surface was thinned to 3 nm or less and the above-described gas etching condition as a sufficient condition in manufacturing the step bunching-free SiC epitaxial wafer as a result of extensive studies.

With respect to the surface of the substrate after the cleaning (gas etching) process, it can be confirmed that the mean-square roughness Rq of the surface of the epitaxial layer, which is obtained by analyzing an area of 35% or more of the entire surface of the wafer using the optical surface inspection device, is 1.3 nm or less. Further, in the case of performing measurement using an atomic force microscope, it can be confirmed that the mean-square roughness is 1.0 nm or less in the area of 10 μm square, and 1.0 nm or less in the area of 200 μm square, and the maximum height difference Ry of the step bunching (short step bunching) having a length of 100 to 500 μm observed in the area of 200 μm square is 3.0 nm or less. Further, it can be confirmed that the linear density of this step is 5 mm$^{-1}$ or less.

In the following deposition process and cooling process, it is important to maintain the flatness of the substrate surface.

SiH$_4$ gas and/or C$_3$H$_8$ gas may be added to the hydrogen gas. Although short step bunching may occur in association with shallow pits due to screw dislocation, the depth of the shallow pits can be thinned and the occurrence of short step bunching in association with shallow pits can be suppressed by performing gas etching through addition of SiH$_4$ gas having a concentration of less than 0.009 mol % to hydrogen gas in order to make the environment in a reactor Si rich.

<Deposition (Epitaxial Growth) Process>

In the deposition (epitaxial growth) process, epitaxial growth of silicon carbide is performed on the surface of the substrate after the cleaning by simultaneously supplying SiH$_4$ gas and C$_3$H$_8$ gas in the amount required for the epitaxial growth of the silicon carbide at a C/Si concentration ratio of 0.7 to 1.2.

Further, as described above, "simultaneous supply" does not mean at exactly the same time, but means supply with a difference in a few seconds. In the case of using a Hot Wall SiC CVD manufactured by Aixtron SE as described in the following embodiment, if the time difference between the supply of SiH$_4$ gas and the supply of C$_3$H$_8$ gas was set to be within five seconds, the step bunching-free SiC epitaxial wafer could be manufactured.

The flow rates of the SiH$_4$ gas and the C$_3$H$_8$ gas, pressure, and the substrate temperature are determined in the ranges of 15 to 150 sccm, 3.5 to 60 sccm, 80 to 250 mbar, and 1400 to 1600° C., respectively, while controlling the uniformity of the thickness and the carrier concentration and the growth rate. By introducing nitrogen gas as a doping gas simultaneously with the start of deposition, the carrier concentration in the epitaxial layer can be controlled. As a method of suppressing step bunching during growth, it is known to lower the C/Si concentration ratio of the raw material gas being supplied in order to increase the migration of Si atoms on the growth surface. In the present invention, the C/Si concentration ratio is 0.7 to 1.2. Further, the growth rate is about 3 to 20 μm per hour. Typically, the epitaxial layer being grown has a thickness of about 5 to 20 μm and carrier concentration of about 2 to $15 \times 10^{15}$ $cm^{-3}$.

<Cooling Process>

In the cooling process, the supply of the $SiH_4$ gas and the supply of the $C_3H_8$ gas are simultaneously stopped, the growth temperature is maintained until the $SiH_4$ gas and the $C_3H_8$ gas are exhausted, and then the cooling is performed.

Although the cooling is performed by cutting off the supply of the $SiH_4$ gas and the $C_3H_8$ gas and the introduced nitrogen gas as the doping gas after the deposition, gas etching occurs on the surface of the SiC epitaxial film to deteriorate the surface morphology. In order to suppress the deterioration of the surface morphology, the timing for stopping the supply of the $SiH_4$ gas and the $C_3H_8$ gas and the cooling timing are important. After simultaneously stopping the supply of the $SiH_4$ gas and the $C_3H_8$ gas, it can be seen that the growth temperature is maintained until such supplied gases are removed from the substrate surface, and then the cooling to room temperature is performed at an average rate of 50° C. per minute to suppress the deterioration of the morphology.

[Embodiment]

Hereinafter, embodiments of the present invention will be described in detail. However, the present invention is not limited to such embodiments.

In this embodiment, $SiH_4$ gas and $C_3H_8$ gas were used as raw material gases, $N_2$ gas was used as a doping gas, and $H_2$ gas or HCL gas was used as a carrier gas and an etching gas. Using the Hot Wall SiC CVD manufactured by Aixtron SE, which was a plural-piece planetary type CVD device, the SiC epitaxial film was formed on the Si surface tilted by 4° in a direction of <11-20> axis with respect to (0001) surface of the 4H—SiC single-crystal. With respect to the roughness of the obtained epitaxial wafer surface, irradiation was made using an optical surface inspection device (Candela CS20 manufactured by KLA-Tencor Corporation), a typical AFM, and an extensive observation type AFM. The extensive observation AFM is an AFM which has lower resolution than the typical AFM in the vertical direction and an observation area of about 200 μm square.

(Embodiment 1)

In the polishing process, abrasive particles having a diameter of 5 μm were used in performing mechanical polishing before CMP, and the processing pressure was 350 $g/cm^2$. Further, the CMP was performed for 30 minutes using silica particles having an average particle diameter of 10 to 150 nm as abrasive particles, sulfate as an inorganic acid, and abrasive slurry having the pH of 1.9 at 20° C.

After RCA cleaning of the substrate after polishing, the substrate was introduced into a growth device. Further, the RCA cleaning is a wet cleaning method generally used with respect to the Si wafer, and can remove organics, heavy metals, and particles on the substrate surface using a solution in which sulfate, ammonia, hydrochloride, and hydrogen peroxide solution are mixed and a hydrofluoric acid solution.

The cleaning (gas etching) process was performed for 10 minutes with the flow rate of a hydrogen gas of 90 slm, the reactor pressure of 200 mbar, and substrate temperature of 1550° C.

In the SiC epitaxial growth process, $C_3H_8$ gas was supplied, and then after three seconds, $SiH_4$ gas was supplied so that the $SiH_4$ gas and the $C_3H_8$ gas having the flow rates of 48 sccm and 17.6 sccm, respectively, are simultaneously supplied onto the substrate surface. As C/Si, 1.1 was selected. The growth process was performed for two hours with the reactor pressure of 200 mbar and the substrate temperature of 1550° C., and a SiC epitaxial layer having a thickness of 10 μm was deposited.

The results of measuring the SiC epitaxial wafer as described above through the extensive observation type AFM and the optical surface inspection device are shown in FIGS. 5(a) and 5(b). Rq measured by the optical surface inspection device was 1.2 nm, Rq measured by the extensive observation type AFM was 0.4 nm, the maximum height difference Ry was 0.7 nm, and no step bunching was observed.

(Embodiment 2)

The SiC epitaxial wafer was manufactured under the same condition as Embodiment 1 except for the gas etching condition. Embodiment 2 is different from Embodiment 1 from the viewpoint that the gas etching process is performed through addition of $SiH_4$ gas having the concentration of 0.008 mol % to the hydrogen gas.

The SiC epitaxial wafer as described above was measured through the optical surface inspection device and the extensive observation type AFM. In the same manner as Embodiment 1, an image was observed. Rq measured by the optical surface inspection device was 1.1 nm, Rq measured by the extensive observation type AFM was 0.4 nm, and the maximum height difference Ry was 0.7 nm.

COMPARATIVE EXAMPLE 1

In the SiC epitaxial growth process, the SiC epitaxial wafer was manufactured under the same condition as Embodiment 1 except that the $SiH_4$ gas and the $C_3H_8$ gas were introduced with the C/Si concentration ratio of 1.9 and the $SiH_4$ gas was introduced after 30 seconds from the introduction of the $C_3H_8$ gas.

The images obtained by measuring the SiC epitaxial wafer through the optical surface inspection device and the extensive observation type AFM are shown in FIGS. 6(b) and 5(b), respectively.

In the Candela image and the AFM image, the related art step bunching was observed over the entire surface of the wafer. The mean-square roughness Rq measured by the optical surface inspection device was 1.7 nm, the mean-square roughness Rq measured by the extensive observation type AFM was 2.4 nm, and the maximum height difference Ry was 3.6 nm.

COMPARATIVE EXAMPLE 2

In the SiC epitaxial growth process, the SiC epitaxial wafer was manufactured under the same condition as Embodiment 1 except that the $SiH_4$ gas was introduced after 30 seconds from the introduction of the $C_3H_8$ gas. Accordingly, as compared with Comparative example 1, the $SiH_4$ gas and the $C_3H_8$ gas were introduced with the C/Si concentration ratio of 1.1.

Figure 9:
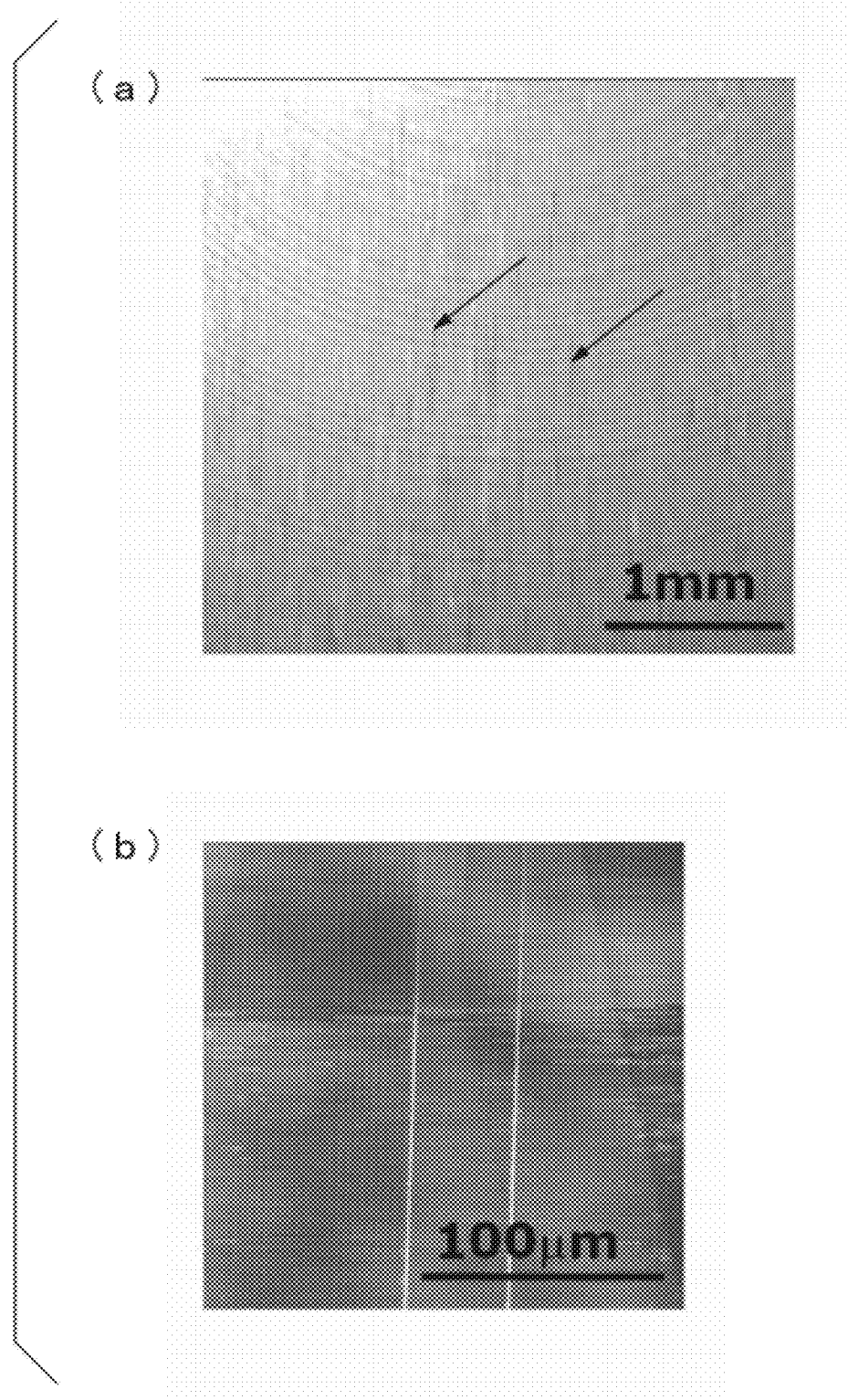
FIG. 9(a) shows an image obtained by observing the surface of a SiC epitaxial wafer according to comparative example 2 through an optical surface inspection device using laser light.
FIG. 9(b) shows an image obtained by observing the same through an extensive observation type AFM.

FIGS. 9(a) and 9(b) show a Candela image and an extensive observation type AFM image with respect to the manufactured SiC epitaxial wafer.

The mean-square roughness Rq measured by the optical surface inspection device was 1.4 nm, the mean-square roughness Rq measured by the extensive observation type AFM was 1.4 nm, and the maximum height difference Ry was 2.8 nm. The linear density of the step was 10 pieces/mm$^{-1}$.

In any one of the Candela image and the AFM image, the related art step bunching was not observed. This result indicates that the C/Si concentration ratio of the SiH$_4$ gas and the C$_3$H$_8$ gas is important in suppressing the occurrence of the related art step bunching. Further, by setting the C/Si concentration ratio to the range of 0.7 to 1.2, it is confirmed that the occurrence of the related art step bunching can be suppressed.

On the other hand, in a part of the Candela image as indicated by arrows in FIG. 9(a), several short step bunchings were observed in the range of 1 mm square. Although short step bunching was found by the inventors, suppression of the occurrence of short step bunching is essential in manufacturing a step bunching-free SiC epitaxial wafer. Further, the inventors found out that even the occurrence of short step bunching could be suppressed by simultaneously supplying SiH$_4$ gas and C$_3$H$_8$ gas in an amount required for epitaxial growth of the silicon carbide at a C/Si concentration ratio of 0.7 to 1.2 to the surface after gas etching of the SiC single-crystal substrate on which the "lattice disorder layer" is of 3 nm or less.

INDUSTRIAL APPLICABILITY

The SiC epitaxial wafer according to the present invention is a step bunching-free SiC epitaxial wafer, and can be used to manufacture various silicon carbide semiconductor devices, such as a power device, a high-frequency device, a high-temperature operation device, or the like.

The invention claimed is:

1. A SiC epitaxial wafer obtained by forming a SiC epitaxial layer on a 4H—SiC single-crystal substrate that is tilted at an off-angle of 0.4° to 5°, wherein when a surface of the SiC epitaxial wafer layer is measured by an optical surface inspection device that uses laser light, mean-square roughness Rq of the surface is 1.3 nm or less, and wherein linear density of steps of the epitaxial layer surface of the wafer is 5 mm$^{-1}$ or less.

2. The SiC epitaxial wafer according to claim 1, wherein the steps are connected to shallow pits due to screw dislocation in the SiC epitaxial layer.

3. A SiC epitaxial wafer obtained by forming a SiC epitaxial layer on a 4H—SiC single-crystal substrate that is tilted at an off-angle of 0.4° to 5°, wherein when a surface of the SiC epitaxial wafer layer is measured by an atomic force microscope, mean-square roughness Rq of the surface is 1.0 nm or less and a maximum height difference Ry is 3.0 nm or less.

4. A method of manufacturing a SiC epitaxial wafer comprising the steps of:
   polishing a 4H—SiC single-crystal substrate that is tilted at an off-angle of 0.4° to 5° until a lattice disorder layer of a surface thereof becomes 3 nm or less;
   cleaning the surface of the substrate after polishing at 1400 to 1600° C. in a hydrogen atmosphere;
   performing epitaxial growth of silicon carbide on the surface of the substrate after the cleaning by simultaneously supplying SiH$_4$ gas and C$_3$H$_8$ gas in the amount required for the epitaxial growth of the silicon carbide at a carbon-to-silicon (C/Si) concentration ratio of 0.7 to 1.2; and
   simultaneously cutting off the supply of the SiH$_4$ gas and the C$_3$H$_8$ gas, maintaining the substrate temperature until the SiH$_4$ gas and the C$_3$H$_8$ gas are exhausted, and then decreasing the temperature.

5. The method of manufacturing a SiC epitaxial wafer according to claim 4, wherein the cleaning step is performed by addition of SiH$_4$ gas and/or C$_3$H$_8$ gas in the hydrogen atmosphere, and
   the step of performing epitaxial growth is initiated after the added gases are exhausted.

* * * * *